(12) United States Patent
Kwon et al.

(10) Patent No.: US 9,391,286 B1
(45) Date of Patent: Jul. 12, 2016

(54) STRETCHABLE DISPLAY DEVICE

(71) Applicant: SAMSUNG DISPLAY CO., LTD., Yongin, Gyeonggi-Do (KR)

(72) Inventors: Jae Joong Kwon, Suwon-si (KR); Chi-O Cho, Gwangju (KR); Sang-Il Park, Yongin-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/792,866

(22) Filed: Jul. 7, 2015

(30) Foreign Application Priority Data

Jan. 15, 2015 (KR) .................. 10-2015-0007619

(51) Int. Cl.
*H01L 31/0203* (2014.01)
*H01L 31/18* (2006.01)
*H01L 27/32* (2006.01)
*H01L 21/00* (2006.01)
*H01L 51/00* (2006.01)
*H01L 27/15* (2006.01)
*H01L 33/40* (2010.01)
*H01L 33/58* (2010.01)
*H01L 33/52* (2010.01)
*H01L 33/62* (2010.01)
*H01L 51/52* (2006.01)

(52) U.S. Cl.
CPC .......... *H01L 51/0097* (2013.01); *H01L 27/156* (2013.01); *H01L 27/3211* (2013.01); *H01L 33/40* (2013.01); *H01L 33/52* (2013.01); *H01L 33/58* (2013.01); *H01L 33/62* (2013.01); *H01L 51/5203* (2013.01); *H01L 51/5237* (2013.01); *H01L 51/5275* (2013.01)

(58) Field of Classification Search
CPC ............ H01L 51/0097; H01L 51/5203; H01L 51/5275; H01L 51/5237; H01L 33/40; H01L 33/52; H01L 33/62; H01L 33/58; H01L 27/156; H01L 27/3211
USPC ............ 257/40, 77, 88, 89, 98, 451, E29.295, 257/E29.324, E21.206, E21.243, E33.041; 438/21, 26, 118; 361/749
See application file for complete search history.

(56) References Cited

U.S. PATENT DOCUMENTS 7,972,875 B2 * 7/2011 Rogers ................ H01L 31/0725
257/E21.206
2006/0038182 A1 * 2/2006 Rogers ................ B82Y 10/00
257/77

(Continued)

FOREIGN PATENT DOCUMENTS

KR 10-0727947 B1 6/2007
KR 10-0955390 B1 4/2010
KR 10-2010-0123755 A 11/2010

*Primary Examiner* — Dao H Nguyen
(74) *Attorney, Agent, or Firm* — Lee & Morse, P.C.

(57) ABSTRACT

An exemplary embodiment provides a stretchable display device which is stretched in at least one direction. The stretchable display device according to the exemplary embodiment includes a stretchable substrate, a display unit, a plurality of rigid lenses, and a transparent elastic part. The display unit is on the stretchable substrate, and includes a plurality of light sources and a plurality of stretchable electrodes. The rigid lenses are disposed to correspond to the plurality of light sources, respectively. The transparent elastic part encloses the plurality of rigid lenses on the display unit and is stretched along with the stretched substrate and when being stretched, forms lens surfaces corresponding to the plurality of rigid lenses, respectively.

10 Claims, 7 Drawing Sheets

(56) References Cited

U.S. PATENT DOCUMENTS

| | | |
|---|---|---|
| 2008/0157235 A1 | 7/2008 | Rogers et al. |
| 2010/0002402 A1 | 1/2010 | Rogers et al. |
| 2013/0334511 A1* | 12/2013 | Savas ................... H01L 51/56 257/40 |
| 2014/0312319 A1* | 10/2014 | Kim ................... H01L 27/3258 257/40 |

* cited by examiner

STRETCHABLE DISPLAY DEVICE

CROSS-REFERENCE TO RELATED APPLICATION

Korean Patent Application No. 10-2015-0007619, filed on Jan. 15, 2015, in the Korean Intellectual Property Office, and entitled: "Stretchable Display Device," is incorporated by reference herein in its entirety.

BACKGROUND

1. Field

The described technology relates generally to a display device, and more particularly, to a stretchable display device having a panel structure which may be expanded or contracted.

2. Description of the Related Art

With the recent development of display device related technologies, the display devices which may be changed in use, such as being folding a screen in half, rolled in a roll form, and stretched in at least one direction, have been researched and developed. The changeable display device may meet dueling demands to make a screen large while the display device is being used and to make the screen small when the display device is not is being used, e.g., to take up less space or to be portable.

Among the changeable display devices, there is a stretchable display device which may be stretched in at least one direction. The stretchable display device has a structure in which a plurality of light sources and a plurality of stretchable electrodes are disposed on the stretchable substrate. When the stretchable display device is stretched, a gap between pixels is formed while an interval between the light sources is increased. That is, since the interval between the light sources is increased in a state (fixed resolution) in which the number of light sources is fixed, a pixel-fill factor is reduced, deteriorating image quality.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a stretchable display device that includes a stretchable substrate, a display unit, a plurality of rigid lenses, and a transparent elastic part. The stretchable substrate may have at least a portion of a stretched area. The display unit may be formed on the stretchable area and include a plurality of light sources and a plurality of stretchable electrodes. The plurality of rigid lenses may be disposed to correspond to the plurality of light sources, respectively. The transparent elastic part may enclose the plurality of rigid lenses on the display unit and may be stretched along with the stretched area and when being stretched, may form lens surfaces corresponding to the plurality of rigid lenses, respectively.

A difference between a refractive index of the transparent elastic part and a refractive index of the rigid lens may be equal to or less than 0.3. The transparent elastic part may form a flat surface in an initial state in which the transparent elastic part is not stretched.

The plurality of light sources may include any one of an organic light emitting diode and an inorganic light emitting diode. The plurality of stretchable electrodes may be each made of conductive polymer having an elastic force.

The plurality of stretchable electrodes may each include a plurality of light source fixing parts and a variable part which connects between two adjacent light source fixing parts and may be made of a metal strip bent once or more. A distance between the light source fixing parts may be expanded while the variable part is unfolded by the external force.

In an initial state, the variable part may have more length than needed to linearly connect two adjacent light source fixing parts. The variable part may include a metal strip.

The plurality of rigid lenses may be disposed to correspond to the plurality of light sources, respectively.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
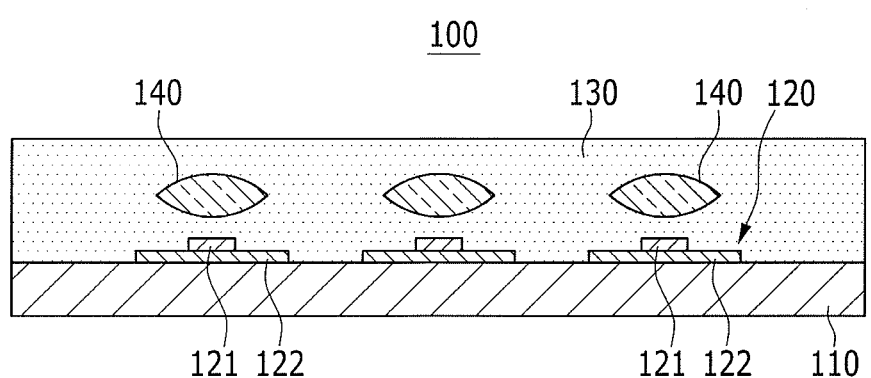
FIG. 1 illustrates a schematic cross-sectional view of a stretchable display device according to the exemplary embodiment.

Hereinafter, the present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

Throughout the present specification, it will be understood that when an element such as a layer, film, region, or substrate is referred to as being "on" another element, it can be directly on the other element or intervening elements may also be present. Further, in the specification, the word "on" means positioning on or below the object portion, but does not essentially mean positioning on the upper side of the object portion based on a gravity direction.

In addition, unless explicitly described to the contrary, the word "comprise" and variations such as "comprises" or "comprising", will be understood to imply the inclusion of stated elements but not the exclusion of any other elements. In addition, the size and thickness of each configuration shown in the drawings are arbitrarily shown for understanding and ease of description, but the present disclosure is not limited thereto.

FIG. 1 is a schematic cross-sectional view of a stretchable display device according to the exemplary embodiment.

Referring to FIG. 1, a stretchable display device 100 includes a stretchable substrate 110, a display unit 120 formed on the stretchable substrate 110, a transparent elastic part 130 formed on the display unit 120, and a plurality of rigid lenses 140 positioned inside the transparent elastic part 130.

The stretchable substrate 110 includes at least one portion of a stretched area and the display unit 120 is on the stretched area. The stretched area is stretched from an initial state in at least one direction by an external force and may be restored to the initial state when the external force is removed. For example, stretchable substrate 110 may be made of a polymer material having predetermined elasticity. The stretched area may be stretched in one direction or may be stretched in two orthogonal directions. As the stretched area is increased, a size of the display unit 120 is also increased.

The display unit 120 includes a plurality of light sources 121 and a plurality of stretchable electrodes 122 connected to a plurality of light sources 121. The plurality of light sources 121 may include an organic light emitting diode (organic LED) or an inorganic light emitting diode (inorganic LED).

The typical light emitting diode includes an emission layer, an anode supplying holes to the emission layer, and a cathode supplying electrons to the emission layer. The electrons and the holes are combined in the emission layer to generate excitons and light is emitted by energy generated when the excitons drop from an excited state to a ground state.

The light sources 121 of a single color may be distributed over the whole of the display unit 120 such that each light source 121 serves as a pixel. Alternatively, the light sources 121 of at least two colors may be distributed over the display unit 120. For example, the display unit 120 may include a red light source, a green light source, and a blue light source, and controls light intensities of the red light source, the green light source, and the blue light source, respectively, thereby implementing a full-color image. That is, similar to the typical display device, the red light source, the green light source, and the blue light source each serve as a sub-pixel, with these three sub-pixels serving as a pixel.

The stretchable electrode 122 electrically connects the plurality of light sources 121 to an external circuit (printed circuit board, and the like) to supply an electrical signal to the light sources 121. The stretchable electrode 122 is stretched, along with the stretchable substrate 110. To this end, the stretchable electrode 122 may be made of a conductive polymer material having predetermined elasticity or may be made of a conductive strip, e.g., a metal strip, which is bent once or more, and the like.

Figure 2:
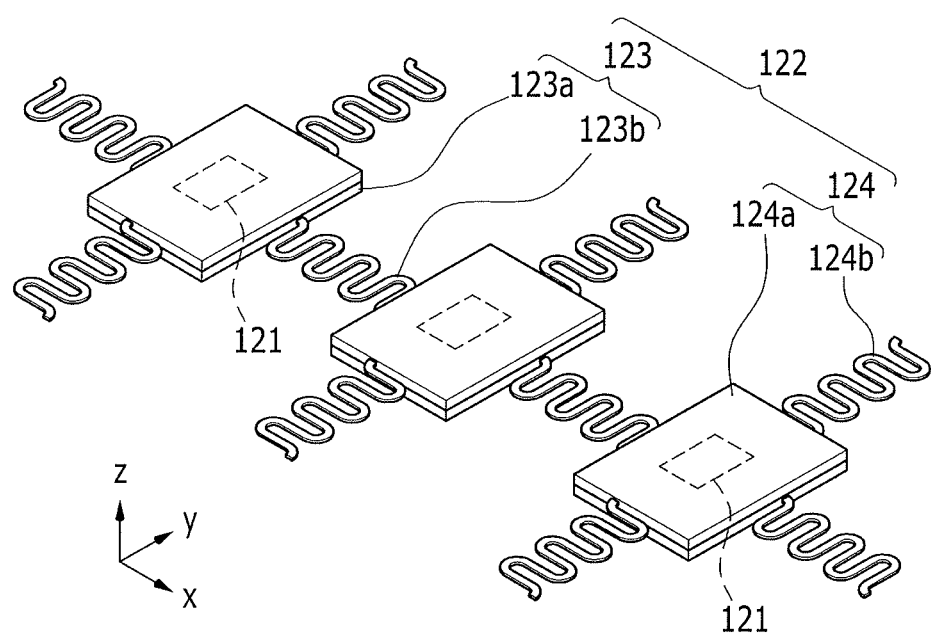
FIG. 2 illustrates a perspective view of an exemplary embodiment of a stretchable electrode in the stretchable display device shown in FIG. 1.

FIG. 2 illustrates a perspective view of an exemplary embodiment of a stretchable electrode in the stretchable display device shown in FIG. 1.

Referring to FIG. 2, the stretchable electrode 122 may include a first electrode 123 and a second electrode 124 that intersect each other, e.g., the first electrode 123 may extend along the x direction, the second electrode may extend along the y direction, and both may be orthogonal to the z direction, i.e. a primary direction of the light emission or a viewing direction. The first electrode 123 may be connected to any one of the anode and the cathode of the light source 121 and the second electrode 124 may be connected to the other thereof. The first electrode 123 may transfer a scan signal and the second electrode 124 may transfer a data signal.

The first electrode 123 and the second electrode 124 may be each configured of flat light source fixing parts 123a and 124a and bent variable parts 123b and 124b which are positioned between two adjacent light source fixing parts 123a and 124a. The variable parts 123b and 124b may be formed in various patterns such as a snaking pattern, i.e., meanderingly bent, a bow shape which is convexly bent upward, and so forth. FIG. 2 illustrates an example of the variable parts 123b and 124b having the snaking pattern. The variable parts 123b and 124b may have any shape having excess length, i.e., more material than needed to connect between two adjacent light source fixing parts when connected in a linear fashion, when the stretchable substrate 110 is in the initial state, i.e., when the variable parts 123b and 124b, are in their initial states, and the shapes and/or fully extended length thereof may be different from one another.

When the stretchable substrate 110 is stretched, the variable parts 123b and 124b are unfolded or otherwise extended and, when, the stretchable substrate 110 returns to the initial state, the variable parts 123b and 124b return to their initial states. The stretchable electrode 122 is not limited to the illustrated example and thereby may be variously changed. For example, the bent variable parts 123b and 124b may include sufficient material between light sources 121 to accommodate the stretch of the stretchable substrate 100, i.e. the bent variable parts 123b and 124b may fully or substantially fully extend, e.g., be partially or completely unbent, when the stretchable substrate 110 is fully stretched.

Referring again to FIG. 1, the display unit 120 is covered with the transparent elastic part 130 and the plurality of rigid lenses 140 are embedded in the transparent elastic part 130. The number of rigid lenses 140 may be equal to the number of light sources 121 and one rigid lens 140 may be disposed on each light source 121. The rigid lens 140 is a lens made of a rigid material, e.g, glass, and maintains a fixed shape regardless of the stretching of the stretchable substrate 110.

The transparent elastic part 130 may be made of a polymer material having excellent elastic force and restoring force, for example, soft silicon resin or elastomer. The transparent elastic part 130 has a smooth surface and is stretched together with the stretchable substrate 110.

The transparent elastic part 130 has substantially the same refractive index as that of the rigid lens 140. The refractive index of the transparent elastic part 130 may be equal to that of the rigid lens 140 or a difference between the refractive index of the transparent elastic part 130 and the refractive index of the rigid lens 140 may be equal to or less than 0.3. If the difference between the refractive index of the transparent elastic part 130 and the refractive index of the rigid lens 140 is larger than 0.3, refraction occurs at a boundary between the rigid lens 140 and the transparent elastic part 130, making the targeted light emission distribution difficult to obtain.

Figure 3:
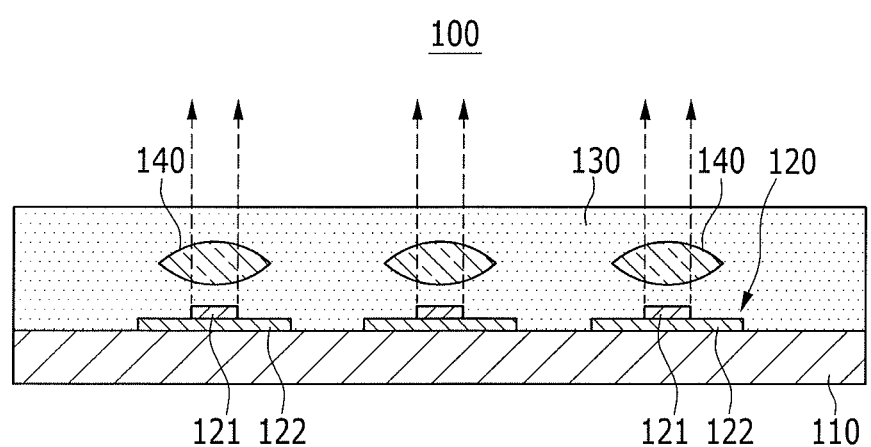
FIG. 3 illustrates a schematic diagram of an optical path in the stretchable display device of FIG. 1.

In the initial state in which the external force is not applied to the stretchable display device 100, the transparent elastic part 130 has a flat surface. FIG. 3 is a schematic cross-sectional view additionally illustrating an optical path in the stretchable display device of FIG. 1.

Referring to FIG. 3, the refractive index of the transparent elastic part 130 is equal to that of the rigid lens 140 and the transparent elastic part 130 has a flat surface and therefore light emitted from the light source 121 is not refracted by the rigid lens 140 and passes through the rigid lens 140 and the transparent elastic part 130 as it is. That is, in the initial state, the rigid lens 140 does not serve as the lens and the transparent elastic part 130 and all of the plurality of rigid lenses 140 serve as a transparent layer. In other words, the rigid lenses 140 are effectively invisible, as the refractive index difference between the transparent elastic part 130 and the rigid lenses 140 is insufficient for the rigid lenses 140 to refract light incident thereon.

Figure 4:
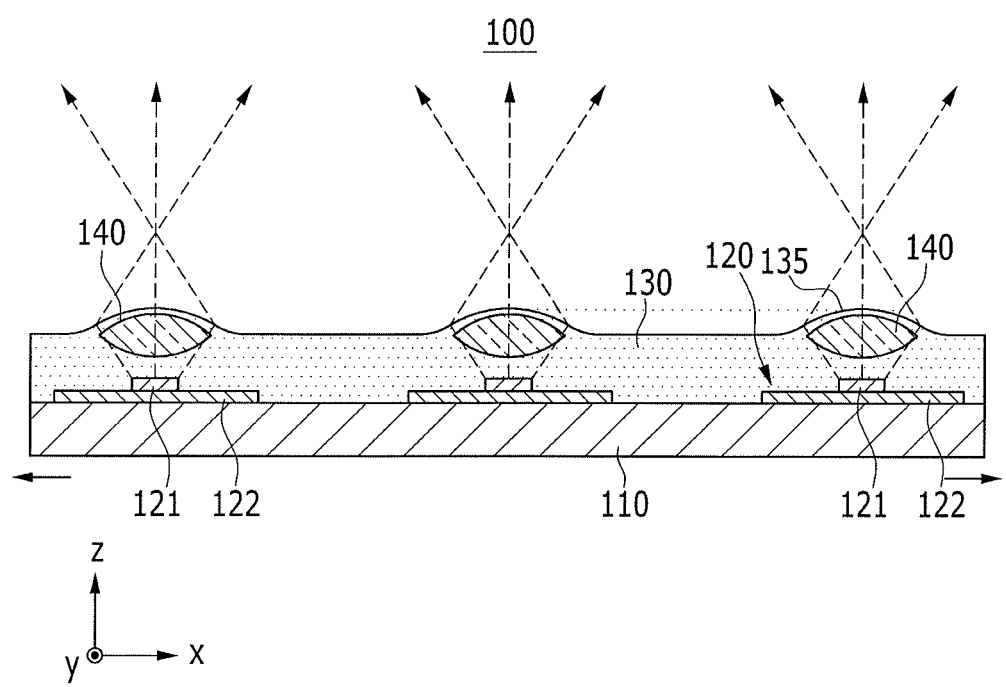
FIG. 4 illustrates a schematic cross-sectional view of a state in which the stretchable display device of FIG. 1 is stretched.

FIG. 4 illustrates a schematic cross-sectional view of a state in which the stretchable display device of FIG. 1 is stretched.

Referring to FIG. 4, when the stretchable substrate 110 is stretched in at least one direction, the light sources 121 are far away from each other and the transparent elastic part 130 may be stretched together with the stretchable substrate 110. In this case, the surface of the transparent elastic part 130 is changed in accordance with the shape of the rigid lens 140 and the transparent elastic part 130 forms convex lens surfaces 135 corresponding to each of the plurality of rigid lenses 140.

As the surface of the transparent elastic part 130 forming the surface of the stretchable display device 100 is formed with the convex lens surface 135, the light emitted from the light source 121 is refracted on the lens surface 135 and is expanded. In other words, the material of the transparent elastic part 130, which now follows the contour of the rigid lenses 140, and the rigid lenses together refract light at the boundary between the lens surface 135 and the outside, e.g., air. Thus, the light is refracted along the x and y directions to decrease apparent spacing between the light sources 121. Therefore, the stretchable display device 100 according to the exemplary embodiment may increase the pixel-fill factor.

Figure 5:
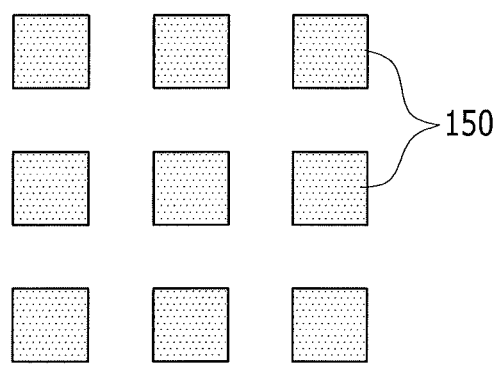
FIG. 5 illustrates a schematic diagram of light emission distributions of light sources in the stretchable display device shown in FIG. 1.

FIG. 5 is a schematic diagram illustrating light emission distributions of light sources in the stretchable display device illustrated in FIG. 3. Referring to FIGS. 3 and 5, the initial state of the stretchable display device 100, the rigid lens 140 does not serve as the lens and therefore light having the same size as the light source 121 is observed. That is, a size of a luminous body 150 which is observed is equal to a size of the light source 121 and a distance between the luminous bodies 150 is equal to a distance between the light sources 121.

Figure 6:
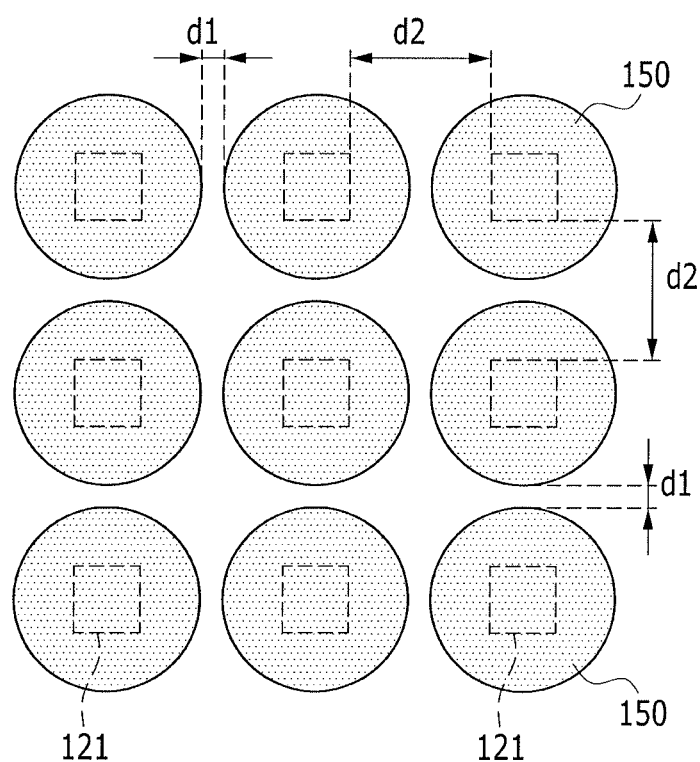
FIG. 6 illustrates a schematic diagram of the light emission distributions of the light sources in the stretchable display device shown in FIG. 4.

FIG. 6 is a schematic diagram illustrating the light emission distributions of the light sources in the stretchable display device illustrated in FIG. 4. Referring to FIGS. 4 and 6, as the stretchable display device 100 is stretched, the light sources 121 are further from each other as compared to the initial state and, as the transparent elastic part 130 forms the lens surface 135, the light emitted from the light source 121 is refracted on the lens surface 135 and is expanded to fill the area between adjacent light sources.

Therefore, the size of the luminous body 150 which is observed is larger than the light source 121, since a distance d1 between the luminous bodies 150 is smaller than an actual distance d2 between the light sources 121. As a result, the gap between the pixels is reduced in the state in which the stretchable display device 100 is stretched to increase the pixel-fill factor, thereby improving the image quality.

Figure 7:
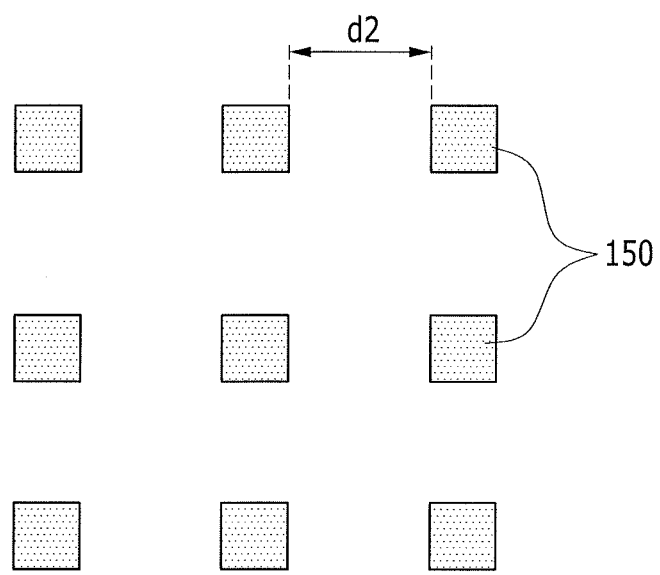
FIG. 7 illustrates a schematic diagram of light emission distributions of light sources in a state in which a stretchable display device of Comparative Example is stretched.

FIG. 7 is a schematic diagram illustrating light emission distributions of light sources in a state in which a stretchable display device of Comparative Example is stretched. The stretchable display device according to Comparative Example is the same as a configuration in which the transparent elastic part and the plurality of rigid lens are omitted in the stretchable display device of the exemplary embodiment.

Referring to FIG. 7, the stretchable display device of Comparative Example does not have a diffusion means such as a lens and therefore when the stretchable display device is stretched, the size of the luminous body 150 which is observed is equal to the size of the light source and the distance between the luminous bodies 150 is equal to the distance between the light sources, i.e., the actual distance d2. Therefore, in the stretchable display device of Comparative Example, a large gap is generated between the pixels to reduce the pixel-fill factor, which leads to the deterioration in the image quality.

As described above, the stretchable display device 100 according to the exemplary embodiment compensates for the deterioration of the pixel-fill factor as the distance between the light sources 121 increases due to refraction of the lens surface 135, thereby reducing deterioration in image quality. In this case, a curvature of the rigid lens 140 may be properly changed depending on the observed distance and the expected degree of change of the transparent elastic part 130 and the separate fixing means for position alignment of light sources 121 the rigid lens 140 may be provided.

The described technology has been made in an effort to provide a stretchable display device capable of increasing a pixel-fill factor in a state in which the stretchable display device is stretched to reduce or prevent image quality from deteriorating. When the stretchable display device is stretched and thus the light sources are far away from each other, the lens surface appears on the surface of the stretchable display device, thereby expanding the light emitted from the light source. Therefore, the gap between the pixels is reduced in the state in which the stretchable display device is stretched to increase the pixel-fill factor, thereby improving the image quality.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A stretchable display device, comprising:
    a stretchable substrate having at least a portion of a stretched area;
    a display unit on the stretched area, the display unit including a plurality of light sources and a plurality of stretchable electrodes;
    a plurality of rigid lenses disposed to correspond to the plurality of light sources; and
    a transparent elastic part enclosing the plurality of rigid lenses on the display unit and stretched along with the stretched area, and, when stretched, form lens surfaces corresponding to the plurality of rigid lenses, respectively.

2. The stretchable display device as claimed in claim 1, wherein:
    a difference between a refractive index of the transparent elastic part and a refractive index of the rigid lens is equal to or less than 0.3.

3. The stretchable display device as claimed in claim 2, wherein:
    in an initial state in which the transparent elastic part is not stretched, the transparent elastic part has a flat surface opposite the stretchable substrate.

4. The stretchable display device as claimed in claim 1, wherein:
    the plurality of light sources include any one of an organic light emitting diode and an inorganic light emitting diode.

5. The stretchable display device as claimed in claim 1, wherein:
    the plurality of stretchable electrodes are each made of conductive polymer having an elastic force.

6. The stretchable display device as claimed in claim 1, wherein:
   the plurality of stretchable electrodes each include a plurality of light source fixing parts and a variable part that connects between two adjacent light source fixing parts.

7. The stretchable display device as claimed in claim 6, wherein:
   a distance between the light source fixing parts increases while the variable part is extended by an external force applied to the stretchable substrate.

8. The stretchable display device as claimed in claim 6, wherein, in an initial state, the variable part has more length than needed to linearly connect two adjacent light source fixing parts.

9. The stretchable display device as claimed in claim 8, wherein the variable part includes a metal strip.

10. The stretchable display device as claimed in claim 1, wherein:
    the plurality of rigid lenses are disposed to correspond to the plurality of light sources, respectively.

* * * * *